(12) United States Patent
Hudait et al.

(10) Patent No.: US 7,791,063 B2
(45) Date of Patent: Sep. 7, 2010

(54) HIGH HOLE MOBILITY P-CHANNEL GE TRANSISTOR STRUCTURE ON SI SUBSTRATE

(75) Inventors: Mantu K. Hudait, Portland, OR (US);
Suman Datta, Port Matilda, PA (US);
Jack T. Kavalieros, Portland, OR (US);
Peter G. Tolchinsky, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 434 days.

(21) Appl. No.: 11/847,780

(22) Filed: Aug. 30, 2007

(65) Prior Publication Data
US 2009/0057648 A1    Mar. 5, 2009

(51) Int. Cl.
*H01L 29/205* (2006.01)
*H01L 21/20* (2006.01)
(52) U.S. Cl. ........................................................ 257/14
(58) Field of Classification Search .................... 257/79, 257/85, 616, 742, 19, 55, 63, 65, 200, 201, 257/E33.009, E31.035, E31.046, E21.342, 257/E21.371, E29.193, E21.102, E21.115, 257/E21.127, E21.129, E21.182, E21.201, 257/E21.207, E21.459
See application file for complete search history.

(56) References Cited

U.S. PATENT DOCUMENTS

| | | | |
|---|---|---|---|
| 5,019,882 A | 5/1991 | Solomon et al. | |
| 5,268,324 A | 12/1993 | Aitken | |
| 5,319,657 A | 6/1994 | Otsuka et al. | |
| 5,357,119 A | 10/1994 | Wang et al. | |
| 5,668,023 A | 9/1997 | Goossen et al. | |
| 5,792,679 A | 8/1998 | Nakato | |
| 5,799,026 A | 8/1998 | Meyer et al. | |
| 6,455,398 B1 | 9/2002 | Fonstad, Jr. et al. | |
| 6,498,063 B1 | 12/2002 | Ping | |
| 6,548,335 B1 | 4/2003 | Huster et al. | |
| 6,858,888 B2 | 2/2005 | Lal et al. | |
| 7,038,243 B1 * | 5/2006 | Kamakura | 257/94 |

(Continued)

OTHER PUBLICATIONS

S.Scholz, et al., "MOVPE growth of GaAs on Ge substrates by inserting a thin low temperature buffer layer," Crystal Research and Technology, Journal for Experimental and industrial Crystallography, 2006, pp. 111-116, vol. 41, No. 2, Wiley Interscience.

(Continued)

*Primary Examiner*—Dao H Nguyen
*Assistant Examiner*—Tram H Nguyen
(74) *Attorney, Agent, or Firm*—Grossman, Tucker, Perreault & Pfleger, PLLC

(57) ABSTRACT

The present disclosure provides an apparatus and method for implementing a high hole mobility p-channel Germanium ("Ge") transistor structure on a Silicon ("Si") substrate. One exemplary apparatus may include a buffer layer including a GaAs nucleation layer, a first GaAs buffer layer, and a second GaAs buffer layer. The exemplary apparatus may further include a bottom barrier on the second GaAs buffer layer and having a band gap greater than 1.1 eV, a Ge active channel layer on the bottom barrier and having a valence band offset relative to the bottom barrier that is greater than 0.3 eV, and an AlAs top barrier on the Ge active channel layer wherein the AlAs top barrier has a band gap greater than 1.1 eV. Of course, many alternatives, variations and modifications are possible without departing from this embodiment.

14 Claims, 5 Drawing Sheets

U.S. PATENT DOCUMENTS

| | | | |
|---|---|---|---|
| 7,098,057 | B2 | 8/2006 | Chu et al. |
| 7,145,167 | B1 | 12/2006 | Chu |
| 7,226,832 | B2 | 6/2007 | Yeo |
| 7,235,497 | B2 | 6/2007 | Powell |
| 7,250,359 | B2 | 7/2007 | Fitzgerald |
| 7,256,077 | B2 | 8/2007 | Orlowski |
| 7,553,691 | B2 * | 6/2009 | Fatemi et al. ............... 438/94 |
| 2001/0025954 | A1 * | 10/2001 | Fischer et al. ............... 257/14 |
| 2004/0173789 | A1 * | 9/2004 | Holonyak et al. ............ 257/14 |
| 2005/0199281 | A1 * | 9/2005 | Fatemi et al. ............. 136/255 |
| 2005/0248003 | A1 | 11/2005 | Tsybeskov et al. |
| 2006/0148182 | A1 | 7/2006 | Datta et al. |
| 2006/0172505 | A1 | 8/2006 | Koester et al. |
| 2007/0051975 | A1 * | 3/2007 | Figuet et al. ............... 257/183 |
| 2007/0137694 | A1 * | 6/2007 | Foster et al. .............. 136/255 |
| 2007/0138565 | A1 | 6/2007 | Datta et al. |
| 2007/0238281 | A1 * | 10/2007 | Hudait et al. ............. 438/604 |

OTHER PUBLICATIONS

S. M Ting, et al., "Range of defect morphologies on GaAs grown on offcut (001) Ge substrates," 1998, available at: http://findarticles.com/p/articles/mi_qa3776/is_099805/ai_n8803665.

B. Sciana, et al., "Epitaxial growth and characterisation of silicon delta-doped GaAs, AlAs and AlxGa1-xAs," Crystal Research and Technology, Journal for Experimental and industrial Crystallography, 2001, pp. 1145-1154, vol. 36, Nos. 8-10, Wiley Interscience.

Minjoo L. Lee, et al., "Strained Ge channel p-type metal-oxide-semiconductor field-effect transistors grown on Si1-xGex/Si virtual substrates," Applied Physics Letters, Nov. 12, 2001, pp. 3344-3346, vol. 79, No. 20.

J.C. Sturm, et al., "High hole mobility p-channel MOSFET's using MOS-gated Si/Si1-xGex Heterostructures," Extended Abstracts of the 1991 International Conference on Solid State Devices and Materials, Yokohama, 1991, pp. 261-263.

Y.H. Xie, et al., "Very high mobility two-dimensional hole gas in Si/GexSi1-x/Ge structures grown by molecular beam epitaxy," Applied Physics Letters, Oct. 18, 1993, pp. 2263-2264, vol. 63, No. 16.

Lawrence H. Friedman, et al., "Size effects and scaling in misfit dislocation formation in self-assembled quantum dots," Technical Proceedings of the 2002 International Conference on Computational Nanoscience and Nanotechnology, 2002, pp. 271-274, vol. 2, Ch. 11.

Dr. Roger M. Nix, "Miller Indices," An Introduction to Surface Chemistry, available at http://www.chem.qmul.ac.uk/surfaces/scc/scat1_1b.htm.

"Crystal Planes in Semiconductors," 1994-2004, available at http://www.ee.byu.edu/cleanroom/EW_orientation.phtml.

Gerald Lucovsky, "Electronic structure of transition metal high-k dielectrics: interfacial band offset energies for microelectronic devices," NH Elsevier, 2003, pp. 212-213.

S. Datta, et al., "85nm gate length enhancement and depletion mode InSb quantum well transistors for ultra high speed and very low power digital logic applications," IEDM Technical Digest, 2005, pp. 763-766.

"Lattice Constants," available at http://www.siliconfareast.com/lattice_constants.htm, Year 2004.

D.J. Paul, "Si/SiGe/Ge Bandstructure," University of Cambridge, 2006, available at http://www.sp.phy.cam.ac.uk/~SiGe/Silicon%20Germanium%20(SiGe)%20Band%20Structure.html.

David P. Brunco, "Germanium: the past and possibly a future material for microelectronics," available at http://ecsmeet6.peerx-press.org/ms_files/ecsmeet6/2007/05/21/00002087/00/2087_0_art_0_jiedii.pdf.

D C Ahlgren, et al., "SiGe Comes of Age in the Semiconductor Industry," Future Fab International., Jul. 2002, Issue 13.

Mayank Bulsara, "Roadmap requirements for emerging materials," Solid State Technology, Jan. 2006, Available At http://sst.pennnet.com/display_article/245013/5ARTCL/none/none/1/Roadmap-requirements-for-emerging-materials.

F.G. Johnson, et al., "Native oxide formation technique for Group III-V semiconductor device fabrication that enhances the oxidation rate," National Security Agency, available at http://www.nsa.gov/techtrans/techt00017.cfm, Date Posted: Jan. 15, 2009.

Chris Mack, "Semiconductor Lithography—The Basic Process," available at http://www.lithoguru.com/scientist/lithobasics.html.

"Deposition Processes—MEMS Thin Film Deposition Processes" available at https://www.memsnet.org/mems/processes/deposition.html.

Brendan Foran, et al., "Strain Measurement by Transmission Electron Microscopy," Future Fab International, Jan. 2006, vol. 20, available at http://www.future-fab.com/documents.asp?d_ID=3711.

Prof. Krishna Saraswat, "EE410 vs. Advanced CMOS Structures," Department of Electrical Engineering, Stanford University, available at http://www.stanford.edu/class/ee410/AdvCMOS.pdf, Feb. 24, 2009.

Katherine Derbyshire, "The Engineered Substrate's Balancing Act: Performance Gains versus Greater Costs and Increased Yield Risks," Yield Management Solutions Magazine, Summer 2004: vol. 6, Issue 2, pp. 25-31.

G.Pourtois, et al., "A step towards a better understanding of silicon passivated (100)Ge p-channel devices," Abstract #558, 211th ECS Meeting, May 6, 2007-May 10, 2007, Chicago, Illinois, available at http://www.ecsdl.org/getpdf/servlet/GetPDFServlet?filetype=pdf&id=MAECES000701000012000558000001&idtype=cvips.

* cited by examiner

HIGH HOLE MOBILITY P-CHANNEL GE TRANSISTOR STRUCTURE ON SI SUBSTRATE

FIELD

The present disclosure describes a high hole mobility p-channel Ge transistor structure on Si substrate.

BACKGROUND

Most modern electronic devices, e.g., computers and cellular telephones, may include semiconductor devices. Semiconductor devices may be manufactured as discrete devices, e.g., transistors, and/or as integrated circuits that may include many interconnected devices on a single semiconductor substrate. The behavior of semiconductor devices may be manipulated by the controlled addition of impurities, e.g., dopants. Design considerations may include device speed and power consumption when designing semiconductor devices and the electronic devices that may include them.

For example, Silicon ("Si") may be used as a substrate and Germanium ("Ge") may be used for an active channel layer. The unequal lattice constants of Si and Ge may require the inclusion of a transition or buffer layer or layers between the Si substrate and the Ge active channel layer. Without these buffer layers, lattice mismatch may result in defects that may make a device inoperable or may cause a device to fail prematurely. In order to address lattice mismatch, a combination of Si and Ge, e.g., $Si_{1-x}Ge_x$ (x=0.4-0.7), may be used for these buffer layers. Although these buffer layers may address the lattice mismatch, they may not provide a complete solution. A Ge active channel layer may suffer from parallel conduction between the active channel and the $Si_{1-x}Ge_x$ buffer layers because of $Si_{1-x}Ge_x$'s relatively low band gap. As a result of parallel conduction between the active channel and the Si1-xGex buffer layer, a relatively large gate voltage may be needed to shut off a device. The $Si_{1-x}Ge_x$—Ge interface may also provide a relatively low valence band offset that may result in inadequate carrier confinement and an associated decrease in carrier mobility. As a result, a semiconductor device constructed with a Si substrate, Ge active channel layer and $Si_{1-x}Ge_x$ buffer layers, may be slower and may consume more power than a semiconductor device without these limitations.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure describes a method and apparatus for implementing a high hole mobility p-channel Germanium ("Ge") transistor structure on a Silicon ("Si") substrate. Hole mobility may affect the switching speed of a device. Higher hole mobility may correspond to a higher switching speed and may thereby provide faster device performance. Ge may have a higher hole mobility relative to Si and to III-V based compound semiconductors. Si may be a relatively more common substrate than Ge that may be used for semiconductor fabrication. Si may be relatively less expensive and may be available in relatively large diameter (e.g., 300 mm or more) ingots and wafers. State-of-the-art 65 nm Si CMOS fabrication capabilities may be readily available. In addition, a high hole mobility p-channel Ge quantum well may be integrated with an n-channel quantum well on a Si substrate. For example, Indium Gallium Arsenide (InGaAs), Indium Antimonide (InSb) or Indium Arsenide (InAs) may be used for the n-channel quantum well. The integrated p-channel and n-channel devices may be useful for ultra-high speed low power CMOS logic applications.

Consistent with the present disclosure the apparatus may include a buffer and/or barrier layer or layers that may bridge material mismatch that may be present between a Ge active device channel layer and the Si substrate. For example, the buffer and/or barrier layer or layers may bridge lattice constant differences that may be present between the Si substrate and the Ge active device channel layer. The buffer and/or barrier layer or layers may further provide hole confinement within the Ge active device channel layer. The buffer and/or barrier layer material may also reduce or eliminate parallel conduction between the Ge active device channel layer and the buffer and/or barrier layer.

Figure 1:
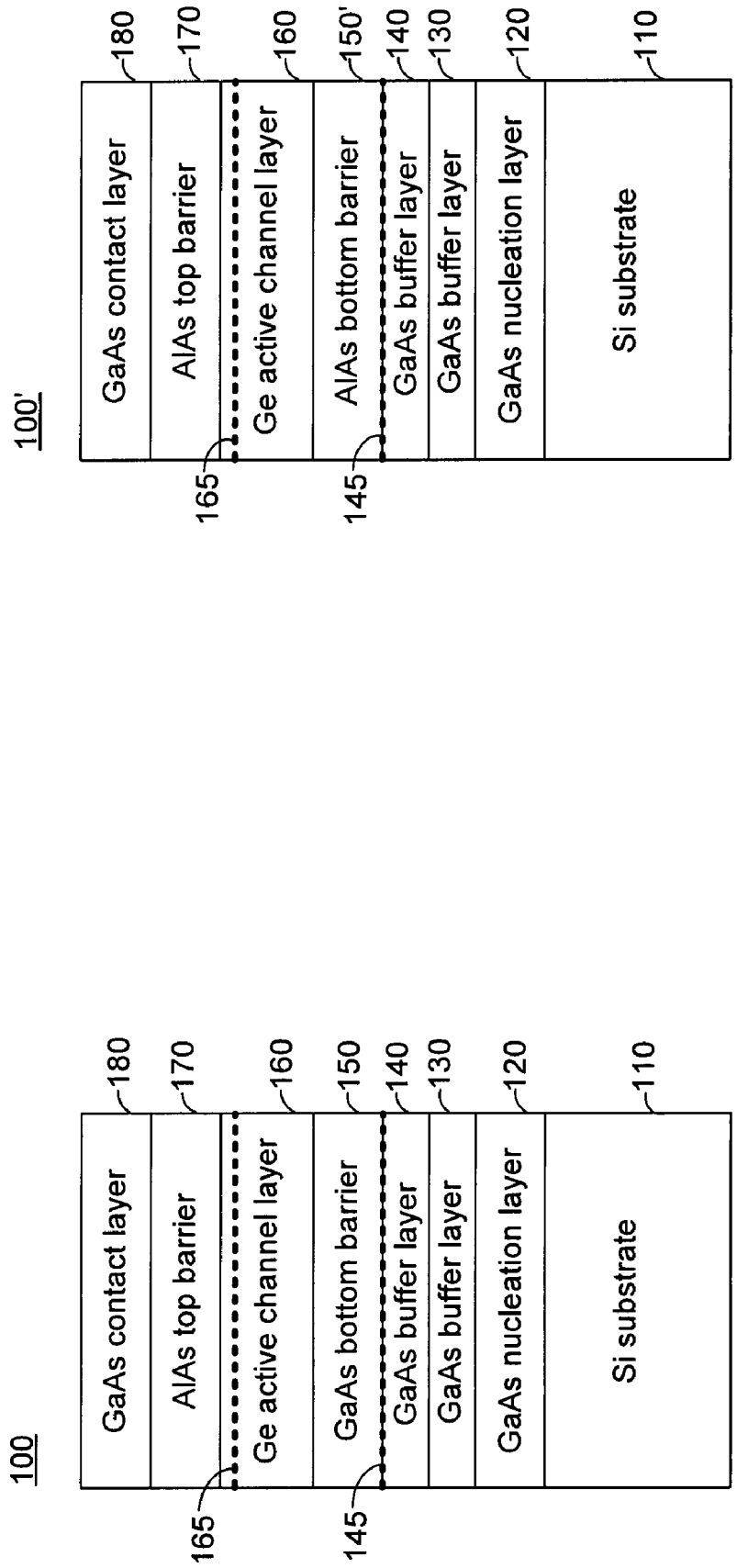
FIGS. 1A and 1B illustrate two exemplary embodiments consistent with the present disclosure.

FIGS. 1A and 1B illustrate two exemplary embodiments of the present disclosure. FIG. 1A depicts a representation of a layer structure of a semiconductor device 100 in accordance with one exemplary embodiment of the present disclosure. A Si substrate 110 may be provided. The Si substrate 110 may be p-type or n-type. The Si substrate 110 may have a resistivity in the range of about 1 Ω-cm to about 50 kΩ-cm, including all values and increments therein. As used herein, "about" may be understood to mean within ±10%, for example, the Si substrate 110 may have a resistivity in the range of 1±0.1 Ω-cm to 50±5 kΩ-cm. The Si substrate 110 may further include a (100) offcut in the range of about 2° to about 8°, including all values and increments therein, toward the [110] direction. In other words, the Si substrate 110 may be cut from the top surface (100) of an ingot but at an angle relative to the surface of the ingot.

A GaAs (Gallium Arsenide) nucleation layer 120 may then be grown on the Si substrate 110. The GaAs nucleation layer 120 may be relatively thin with a thickness in the range of about 30 Å (Angstrom) to about 500 Å, including all values and increments therein. The GaAs nucleation layer 120 may be grown on the Si substrate 110 at relatively low temperatures, i.e., temperatures in the range of about 400° C. to about 500° C., including all values and increments therein. The GaAs nucleation layer 120 may be formed via metal organic chemical vapor deposition (MOCVD) or molecular beam epitaxy (MBE), or another such process. The GaAs nucleation layer 120 may fill the lowest Si substrate 110 terraces with atomic bi-layers of GaAs material. The GaAs nucleation layer 120 may create an anti-phase domain-free "virtual polar" substrate.

A first GaAs buffer layer 130 may then be grown on the GaAs nucleation layer 120. The first GaAs buffer layer may have a thickness in the range of about 0.2 μm to about 1.0 μm, including all values and increments therein. The first GaAs buffer layer may be grown at temperatures in the range of about 400° C. to about 600° C., including all values and increments therein. Growth of the first GaAs buffer layer 130 may include thermal cycle annealing. The thermal cycle annealing may reduce dislocations that may be present in the crystal structure of the first GaAs buffer layer 130 and/or the GaAs nucleation layer 120 at or near the interface with the Si substrate 110. Dislocations may be caused by lattice mismatch between GaAs and Si.

A second GaAs buffer layer 140 may then be grown on the first GaAs buffer layer 130. The second GaAs buffer layer 140 may have a thickness in the range of about 0.2 μm to about 5.0 μm, including all values and increments therein. The second GaAs buffer layer 140 may be grown at relatively higher temperatures, i.e., temperatures in the range of about 500° C. to about 650° C., including all values and increments therein. Growth of the second GaAs buffer layer 140 at the relatively higher temperatures may provide relatively higher structural quality of the layer 140.

A doped layer 145 may then be provided. The doped layer 145 may provide holes (charge carriers) to a Ge active channel layer, e.g., layer 160. The doped layer 145 may be grown on the second GaAs buffer layer and may be a relatively thin (i.e., thickness less than 50 Å) layer of doped GaAs or a delta-doped As (Arsenic) layer. The dopant may be Beryllium or Carbon, for example, and may provide holes, i.e. acceptors. Growth of a doped layer, prior to forming an active device channel, e.g., quantum well, may be considered an inverted doping structure. In another exemplary embodiment, growth of a doped layer may not occur until after the growth of an active device channel, for example, on a top barrier. Growth of a doped layer after growth of an active device channel may be considered a normal doping structure. The doping may be δ-doping, modulation doping, flat doping or another type of doping. δ-doping may be understood to yield dopant atoms that may be spatially confined within one atomic layer, i.e., a delta-function-like doping profile. Modulation doping may be understood to yield a nonuniform, quasi-periodic distribution of dopant atoms across a doped layer. Flat doping may be understood to yield a substantially uniform distribution of dopant atoms across a doped layer.

Continuing with the inverted doping structure, an GaAs bottom barrier 150 may then be grown. The GaAs bottom barrier 150 may have a thickness in the range of about 30 Å to about 100 Å, including all values and increments therein. A Ge active channel layer 160 may then be grown on the GaAs bottom barrier 150. The Ge active channel layer 160 may be grown to a thickness in the range of about 100 Å to about 500 Å, including all values and increments therein, at a temperature in the range of about 350° C. to about 500° C., including all values and increments therein. The thickness of the GaAs bottom barrier 150 may affect charge carrier density in the Ge active channel layer 160. A relatively thinner GaAs bottom barrier 150 may provide greater carrier density in the Ge active channel layer but may reduce carrier mobility because of scattering between the carriers and dopant. A relatively thicker GaAs bottom barrier 150 may reduce carrier density but may not decrease carrier mobility because the relatively thicker GaAs bottom barrier 150 may reduce scattering.

An AlAs top barrier 170 may then be grown on the Ge active channel layer 160 at a temperature in the range of about 400° C. to about 600° C., including all values and increments therein. The AlAs top barrier 170 may be grown to a thickness in the range of about 100 Å to about 200 Å, including all values and increments therein. The Ge active channel layer 160 may be a quantum well. A quantum well may be understood to be a potential well that may confine particles in one dimension and may, therefore, cause them to occupy a planar region. Finally, a GaAs contact layer 180 may be grown to a thickness in the range of about 100 Å to about 500 Å, including all values and increments therein, on the AlAs top barrier 170.

FIG. 1B depicts another representation of a layer structure of a semiconductor device 100' in accordance with another exemplary embodiment of the present disclosure. Layers 110, 120, 130, 140, 160 and 180 and doped layer 145 may be the same as the layers with like designations depicted in FIG. 1A. In this embodiment, an AlAs bottom barrier 150' may be grown prior to growth of the Ge active channel layer 160. Similar to the embodiment depicted in FIG. 1A, following the growth of the Ge active channel layer, an AlAs top barrier 170 may be grown. The GaAs contact layer 180 may then be grown on the AlAs top barrier 170.

Figure 2:
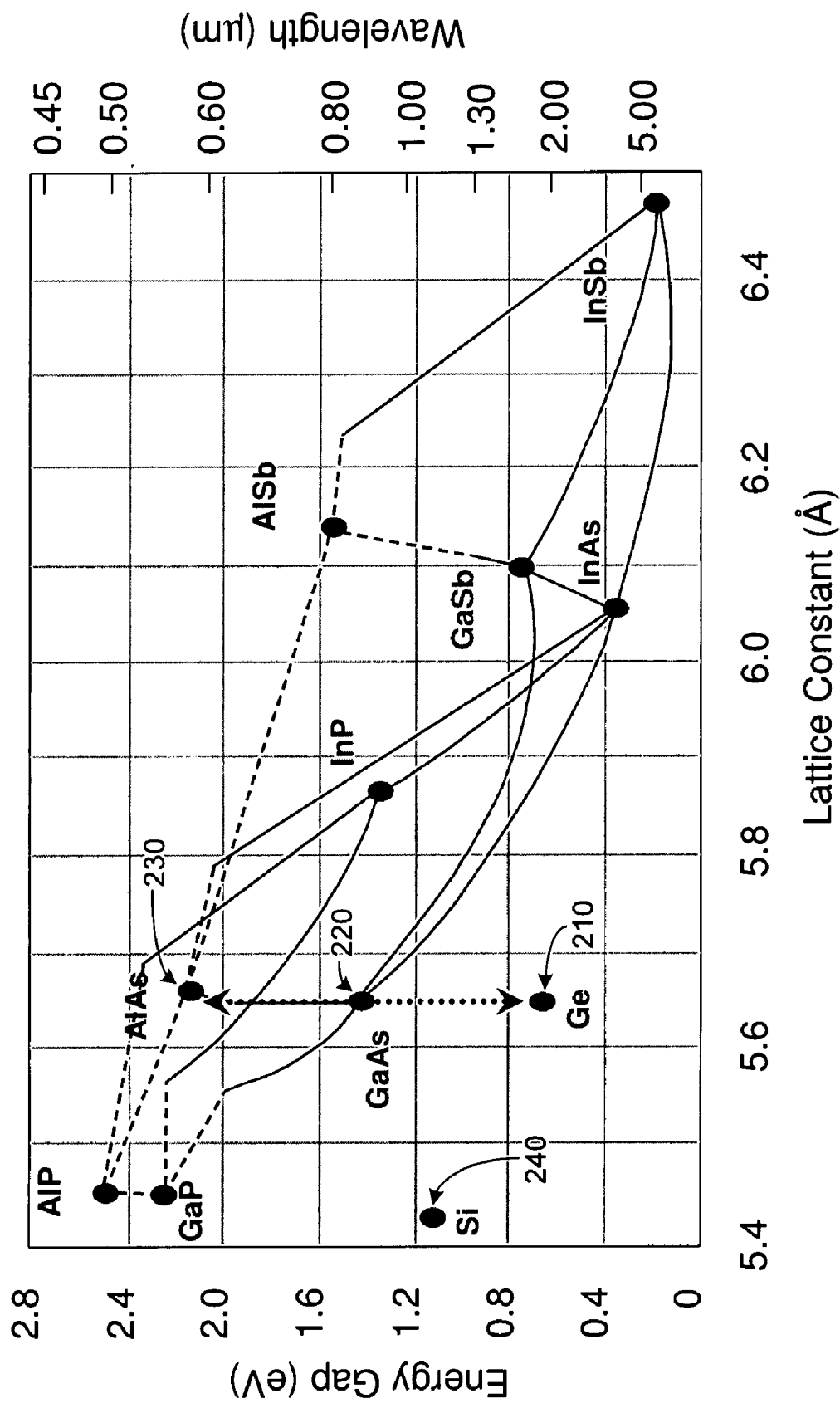
FIG. 2 depicts band diagrams versus lattice parameters for a plurality of semiconductors.

Mismatched lattice constants between active device layers and adjacent layers may result in defects (e.g., dislocations, stacking faults, twins (i.e., breaks in the periodic arrangement of atoms)) that may degrade the operation of a semiconductor device. FIG. 2 depicts band diagrams versus lattice parameters for a plurality of semiconductor materials. The Si (FIG. 2, 240) substrate 110 may have a lattice constant of about 5.431 Å (Angstrom). The GaAs (FIG. 2, 220) layers 120, 130, 140, 150, 180 may have a lattice constant of about 5.653 Å. The AlAs (FIG. 2, 230) layers 150', 170 may have a lattice constant of about 5.660 Å. The Ge (FIG. 2, 210) active channel layer 160 may have a lattice constant of about 5.658 Å. The AlAs layers 150', 170 and the Ge active channel layer 160 may be considered to have relatively closely matched lattice constants with a difference of about 0.04%. The GaAs layers 120, 130, 140, 150, 180 and the Ge active channel layer 160 may be considered to have relatively matched lattice constants with a difference of about 0.09%. The Si substrate 110 and the Ge active channel layer 160 may be considered to have mismatched lattice constants with a difference of about 4%. GaAs layers 120, 130 and 140 and the GaAs and AlAs bottom barriers 150, 150' may bridge the lattice mismatch between the Si substrate 110 and the Ge active channel layer 160. The lattices of the GaAs and AlAs bottom barriers 150, 150' may sufficiently match the lattice of the Ge active channel layer 160 so that associated defects, e.g., dislocations, that may be present in the Ge active channel layer 160 due to lattice mismatch may be minimized and/or may not propagate.

Figure 3:
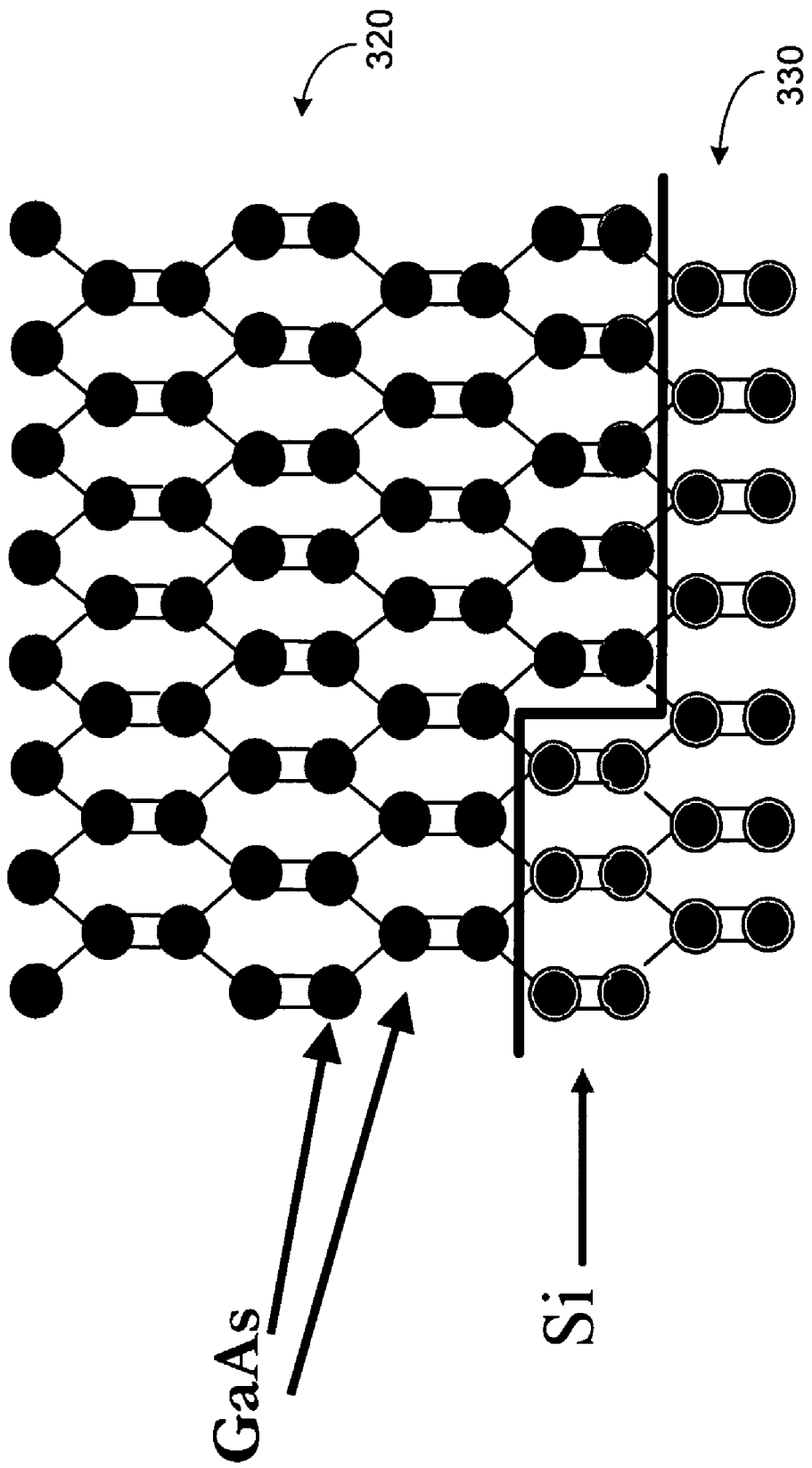
FIG. 3 depicts an exemplary schematic representation of single domain GaAs on a Si substrate.

FIG. 3 depicts an exemplary schematic representation of GaAs 320 on a Si substrate 330. GaAs may be a polar material meaning GaAs may form both covalent and ionic bonds. Si may be a nonpolar material, i.e., Si may form only covalent bonds. Growth of a nucleation layer between a nonpolar substrate and a polar material may improve bonding between the polar material and the substrate and may reduce antiphase domains. Antiphase domains may be bonds of Ga—Ga or As—As, for example, that may increase device leakage. FIG. 3 illustrates a single domain GaAs layer 320 that may have been grown on a Si substrate 330. In other words, the GaAs layer 320 may not have antiphase domain defects.

Figure 4:
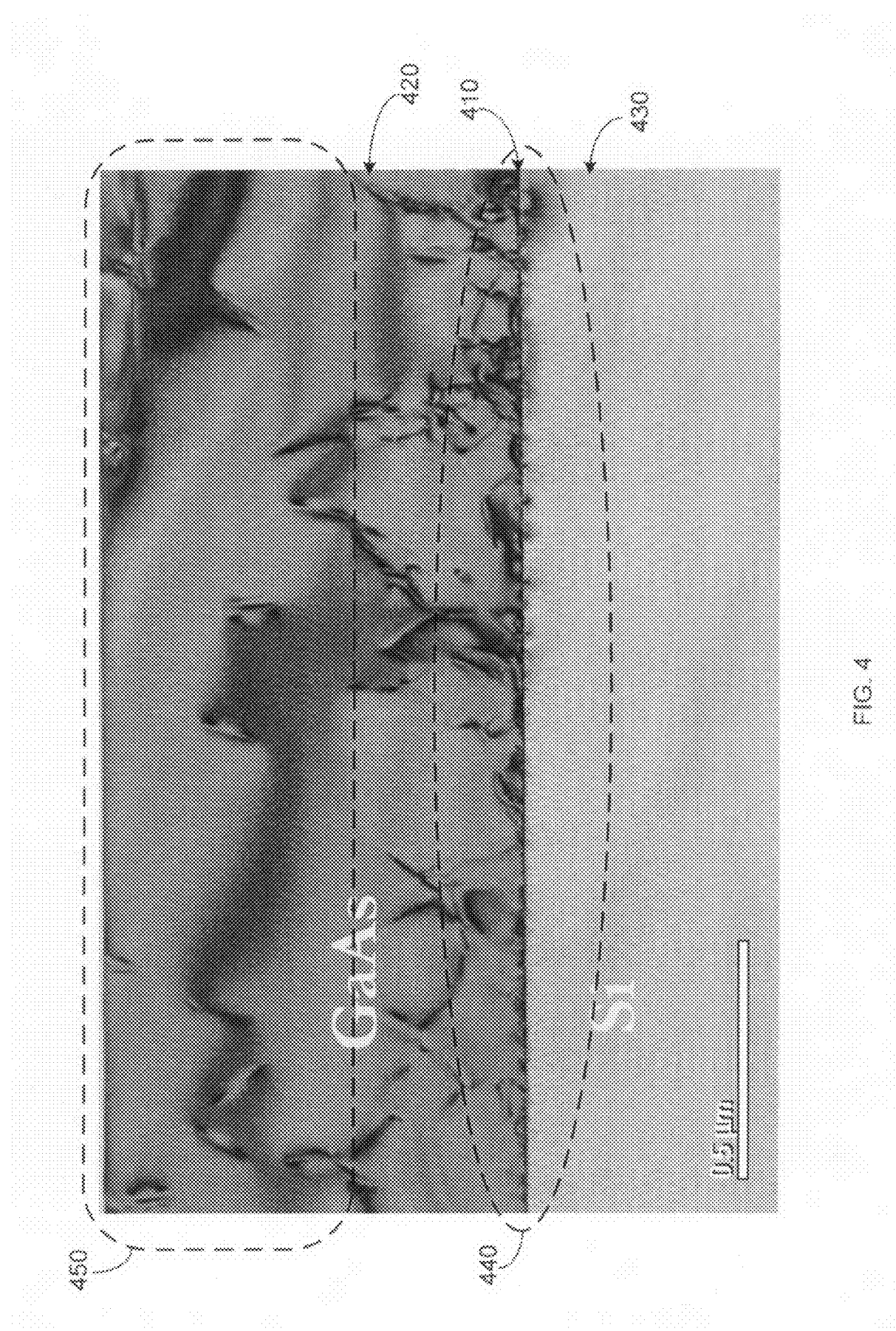
FIG. 4 depicts an exemplary TEM image of a 0.8 μm GaAs layer grown on Si.

FIG. 4 depicts an exemplary TEM image of an 0.8 μm thick GaAs layer 420 grown on Si 430. GaAs and Si may not be relatively lattice matched and may have a lattice mismatch of about 4%. As may be seen in FIG. 4, defects 440 may be present at the interface 410 between the Si layer 430 and the GaAs layer 420. As may be further seen, for example, in FIG. 4, the defect density may decrease with increasing layer thickness, e.g., region 440 as compared to region 450. The overall defect density may be decreased through selection of growth conditions, e.g., thermal cycle annealing, growth rate, flux ratio of As (Arsenic) to Ga (Gallium), etc.

The magnitude of a valence band offset between the Ge active channel layer 160 and the GaAs and AlAs bottom barriers 150, 150' may affect hole confinement within the Ge active channel layer 160. A greater valence band offset may provide superior hole confinement than a lower valence band offset. Superior hole confinement may then increase 2DHG (two dimensional hole gas) mobility. A two dimensional hole gas may be defined as a gas of holes that may be free to move in two dimensions but may be relatively tightly confined in a third dimension. For example, a 2DHG may be present in a quantum well, e.g., 165 of FIGS. 1A and 1B. As discussed above, increased hole mobility may provide faster switching.

Figure 5B:
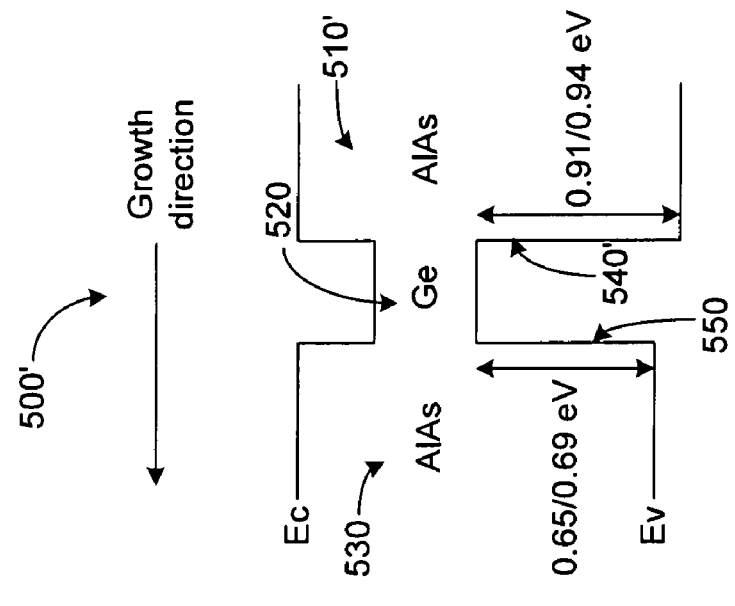
FIGS. 5A and 5B depict band offsets for two exemplary material interfaces.
Figure 5A:
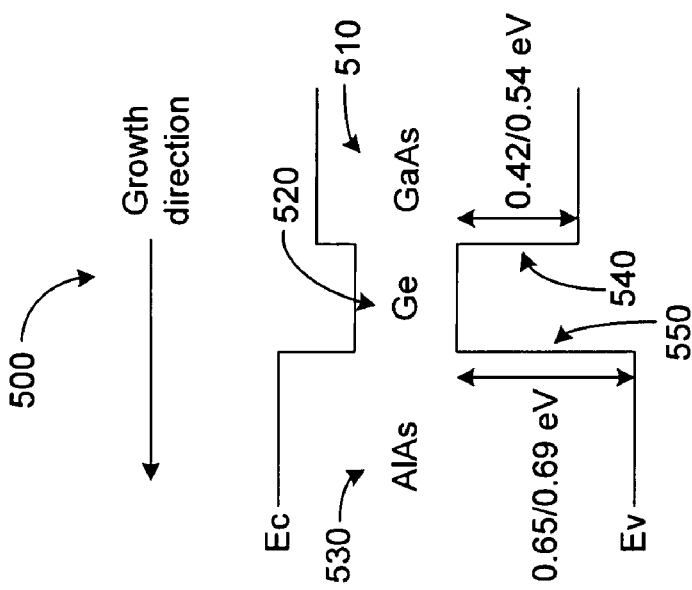

FIGS. 5A and 5B depict, for example, valence band offsets 500, 500' for two exemplary material interfaces. FIG. 5A illustrates a Ge active channel layer 520 between a GaAs bottom layer 510 and an AlAs top layer 530. As depicted in FIG. 5A, the GaAs bottom layer 510 may be grown first, followed by the Ge active channel layer 520 and then the AlAs top layer 530. In this configuration, the GaAs-Ge interface 540 may have a valence band offset of about 0.42 eV for a Ge quantum well and about 0.54 eV for an isolated interface. The Ge-AlAs interface 550 may have a valence band offset of about 0.65 eV for a Ge quantum well and about 0.69 eV for an isolated interface. As a comparison, a $Si_{1-x}Ge_x$ barrier layer with a Ge active channel layer may have a valence band offset in the range of about 0.2 to about 0.3 eV. A higher valence band offset may provide superior hole confinement. An AlAs—Ge (e.g., FIG. 1A, AlAs top barrier 170 and Ge active channel layer 160) interface may provide superior hole confinement as compared to a $Si_{1-x}Ge_x$—Ge interface.

FIG. 5B illustrates a Ge active channel layer 520 between an AlAs bottom layer 510' and a AlAs top layer 530. As depicted in FIG. 5B, the AlAs bottom layer 510' may be grown first, followed by the Ge active channel layer 520 and then the AlAs top layer 530. In this configuration, the AlAs-Ge interface 550 may have a valence band offset of about 0.65 eV for a Ge quantum well and about 0.69 eV for an isolated interface. The Ge-AlAs interface 540' may have a valence band offset of about 0.91 eV for a Ge quantum well and about 0.94 eV for an isolated interface. As noted above, a $Si_{1-x}Ge_x$ barrier layer with a Ge active channel layer may have a valence band offset in the range of about 0.2 to about 0.3 eV. A higher valence band offset may provide superior hole confinement. An AlAs—Ge (e.g., FIG. 1B, AlAs top barrier 170 and Ge active channel layer 160) interface may provide superior hole confinement as compared to a $Si_{1-x}Ge_x$—Ge interface.

It may be appreciated that for a Ge quantum well configured, for example, according to either FIG. 5A or FIG. 5B, the carriers (holes) may be confined inside the quantum well. In other words, such Ge quantum well may be described as a type I quantum well. A type I quantum well may be defined as a quantum well having band offsets such that the conduction band edge of a barrier layer or layers is higher in energy than the conduction band edge of the quantum well layer or layers and the valence band edge of the barrier layer or layers is lower in energy than the valence band edge of the quantum well layer or layers such that the wave functions for the lowest conduction sub-band and highest valence sub-band may be localized in the same quantum well layer or layers. Conversely, a $Si_{1-x}Ge_x$ bottom layer with a Ge active channel layer may provide a Type II quantum well where the wave functions for the lowest conduction sub-band and highest valence sub-band may be localized primarily in different quantum well layer or layers.

The magnitudes of the band gaps of the GaAs and AlAs bottom barriers 150, 150' and the AlAs top barrier 170 may affect parallel conduction between the Ge active channel layer 160 and the buffer and/or GaAs contact layers. Parallel conduction may lead to a very small $I_{on}/I_{off}$ ratio in Ge quantum well based transistors. Further, the Ge quantum well based transistors may require a higher drive voltage to turn them off for both long channel and short channel devices. Parallel conduction may also detrimentally affect (e.g., reduce) effective hole mobility in an active device channel.

Referring to FIG. 2, GaAs 220 may have a band gap of about 1.424 eV and AlAs 230 may have a band gap of about 2.18 eV. Ge 210 may have a band gap of about 0.67 eV and S±240 may have a band gap of about 1.1 eV. A combination of Si and Ge ($Si_{1-x}Ge_x$) may then have a band gap between about 0.67 eV and about 1.1 eV, depending upon the value of the parameter x. It may be appreciated that both GaAs and AlAs may have band gaps greater than the band gaps of $S_{1-x}Ge$ and $Si_{1-x}Ge_x$. Higher band gaps may correspond to materials having insulating properties while smaller band gaps may correspond to materials that act more like conductors. Accordingly, layers of GaAs and AlAs, e.g., 150, 150' and 170, may provide superior isolation to the Ge active channel layer 160 than layers of $Si_{1-x}Ge_x$.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A semiconductor device, comprising:
  a Si substrate;
  a buffer layer on said Si substrate, said buffer layer comprising a GaAs nucleation layer, a first GaAs buffer layer, and a second GaAs buffer layer;
  a bottom barrier on said buffer layer, said bottom barrier having a band gap greater than about 1.1 eV;
  a Ge active channel layer on said bottom barrier wherein a valence band offset between said bottom barrier and said Ge active channel layer is greater than about 0.3 eV; and
  an AlAs top barrier on said Ge active channel layer wherein said AlAs top barrier has a band gap greater than about 1.1 eV.

2. The semiconductor device of claim 1, wherein:
  said bottom barrier is GaAs.

3. The semiconductor device of claim 1, wherein:
  said bottom barrier is AlAs.

4. The semiconductor device of claim 1, wherein:
  said Si substrate has a (100) offcut in the range of about 2 to about 8 degrees toward the [110] direction.

5. The semiconductor device of claim 1, wherein:
  said GaAs nucleation layer has a thickness in the range of about 30 Å(Angstrom) to about 500 Å, said first GaAs buffer layer has a thickness in the range of about 0.2 μm to about 1.0 μm, and said second GaAs buffer layer has a thickness in the range of about 0.2 μm to about 5.0 μm.

6. The semiconductor device of claim 1, further comprising:

a first doped layer on said second GaAs buffer layer, wherein said bottom barrier is on said first doped layer, wherein a dopant is Beryllium or Carbon.

7. The semiconductor device of claim 1, further comprising:
a second doped layer on said AlAs top barrier, wherein a dopant is Beryllium or Carbon.

8. A semiconductor device comprising:
a Si substrate having a (100) offcut toward the [110] direction;
a buffer layer on said Si substrate, said buffer layer comprising a GaAs nucleation layer, a first GaAs buffer layer, and a second GaAs buffer layer;
a bottom barrier on said buffer layer wherein said bottom barrier has a band gap greater than about 1.1 eV;
a Ge active channel layer on said bottom barrier wherein a valence band offset between said bottom barrier and said Ge active channel layer is greater than about 0.3 eV;
an AlAs top barrier on said Ge active channel layer wherein said AlAs top barrier has a band gap greater than about 1.1 eV; and
a GaAs contact layer on said AlAs top barrier.

9. The semiconductor device of claim 8, wherein:
said offcut is in the range of about 2 to about 8 degrees.

10. The semiconductor device of claim 8, wherein:
said bottom barrier is GaAs.

11. The semiconductor device of claim 8, wherein:
said bottom barrier is AlAs.

12. The semiconductor device of claim 8, wherein:
said GaAs nucleation layer has a thickness in the range of about 30 Å to about 500 Å, said first GaAs buffer layer has a thickness in the range of about 0.2 μm to about 1.0 μm, and said second GaAs buffer layer has a thickness in the range of about 0.2 μm to about 5.0 μm.

13. The semiconductor device of claim 8, further comprising:
a first doped layer on said second GaAs buffer layer, wherein said bottom barrier is on said first doped layer, wherein a dopant is Beryllium or Carbon.

14. The semiconductor device of claim 8, further comprising:
a second doped layer on said AlAs top barrier, wherein a dopant is Beryllium or Carbon.

* * * * *